United States Patent
Miki et al.

(10) Patent No.: US 9,000,469 B2
(45) Date of Patent: Apr. 7, 2015

(54) NITRIDE GROUP SEMICONDUCTOR LIGHT EMITTING DEVICE

(75) Inventors: Yasuhiro Miki, Tokushima (JP); Masahiko Onishi, Anan (JP); Hirofumi Nishiyama, Tokushima (JP); Shusaku Bando, Anan (JP)

(73) Assignee: Nichia Corporation, Anan-shi (JP)

( * ) Notice: Subject to any disclaimer, the term of this patent is extended or adjusted under 35 U.S.C. 154(b) by 22 days.

(21) Appl. No.: 13/991,903

(22) PCT Filed: Oct. 13, 2011

(86) PCT No.: PCT/JP2011/073583
§ 371 (c)(1),
(2), (4) Date: Jun. 6, 2013

(87) PCT Pub. No.: WO2012/077407
PCT Pub. Date: Jun. 14, 2012

(65) Prior Publication Data
US 2013/0256732 A1   Oct. 3, 2013

(30) Foreign Application Priority Data
Dec. 8, 2010 (JP) ................................ 2010-274125

(51) Int. Cl.
*H01L 33/40* (2010.01)
(52) U.S. Cl.
CPC ..... *H01L 33/405* (2013.01); *H01L 2224/48091* (2013.01); *H01L 2924/014* (2013.01); *H01L 2933/0016* (2013.01); *H01L 2224/45144* (2013.01)
(58) Field of Classification Search
CPC ................ H01L 2224/48091; H01L 2924/00; H01L 2924/00014; H01L 33/405; H01L 33/44; H01L 2224/05647; H01L 2224/13099; H01L 2924/0105; H01L 2924/014; H01L 33/32; H01L 33/0079; H01L 33/38

USPC ................. 257/98, 13, 96, E33.064, E33.072
See application file for complete search history.

(56) References Cited

U.S. PATENT DOCUMENTS

2006/0261355 A1   11/2006   Kususe et al.
2007/0108458 A1   5/2007   Kamei
(Continued)

FOREIGN PATENT DOCUMENTS

| JP | 2003-224298 | 8/2003 |
| JP | 2005-197670 | 7/2005 |

(Continued)

OTHER PUBLICATIONS

International Search Report for corresponding International Application No. PCT/JP2011/073583, Jan. 10, 2012.

*Primary Examiner* — Chuong A Luu
*Assistant Examiner* — Rodolfo Fortich
(74) *Attorney, Agent, or Firm* — Mori & Ward, LLP

(57) ABSTRACT

A nitride group semiconductor light emitting device includes a nitride group semiconductor layer, and an electrode structure. The electrode structure is arranged on or above the semiconductor layer, and includes a plurality of deposited metal layers. The plurality of deposited metal layers of the electrode structure includes first and second metal layers. The first metal layer is arranged on the semiconductor layer side. The second metal layer is arranged on or above the first metal layer. The first metal layer contains Cr, and a first metal material. The first metal material has a reflectivity higher than Cr at the light emission peak wavelength of the light emitting device. According to this construction, the first metal layer can have a higher reflectivity as compared with the case where the first metal layer is only formed of Cr, but can keep tight contact with the semiconductor layer.

19 Claims, 7 Drawing Sheets

(56) References Cited

U.S. PATENT DOCUMENTS

| | | |
|---|---|---|
| 2008/0210957 A1* | 9/2008 | Watanabe et al. ............... 257/89 |
| 2008/0241526 A1 | 10/2008 | Ou et al. |
| 2009/0057707 A1* | 3/2009 | Katsuno et al. ................ 257/99 |
| 2011/0089401 A1* | 4/2011 | Hiraiwa et al. ................ 257/13 |
| 2013/0020609 A1 | 1/2013 | Ou et al. |

FOREIGN PATENT DOCUMENTS

| | | |
|---|---|---|
| JP | 2006-41133 | 2/2006 |
| JP | 2006-324511 | 11/2006 |
| JP | 2008-258615 | 10/2008 |
| JP | 2010-28100 | 2/2010 |
| JP | 2010-40654 | 2/2010 |

* cited by examiner

NITRIDE GROUP SEMICONDUCTOR LIGHT EMITTING DEVICE

FIELD OF THE INVENTION

The present invention relates to a light emitting device that includes nitride group semiconductors (e.g., general formula $In_xAl_yGa_{1-x-y}N$ ($0 \leq x$, $0 \leq y$, $x+y \leq 1$), and in particular to an electrode structure of this light emitting device.

DESCRIPTION OF THE RELATED ART

Nitride group semiconductor light emitting devices are typically used for light emitting devices such as light emitting diode (LED) and laser diode (LD), photoreceptor devices such as solar cell and optical sensor, electronic devices such as transistor and power device, and the like. In particular, light emitting diodes of nitride group semiconductor light emitting devices that include nitride group materials (hereinafter, occasionally referred to simply as "GaN") are widely used for the various light sources for backlighting, lighting fixtures, traffic lights, large-size displays, and the like.

Generally, the nitride group semiconductor devices have a structure that includes n-type and p-type nitride group semiconductor layers, and n-side and p-side electrodes. The n-type nitride group semiconductor layer is deposited on or above a substrate. The p-type nitride group semiconductor layer is deposited on or above the n-type layer. The n-side and p-side electrodes are electrically connected to the n-type and p-type nitride group semiconductor layer, respectively. In the case where both the electrodes are formed on the upper surface side, the p-type nitride group semiconductor layer, which is formed on the upper side, is partially removed so that the n-type nitride group semiconductor layer is partially exposed. The n-side electrode is formed on the exposed part of the n-type nitride group semiconductor layer, while the p-side electrode is formed on the p-type nitride group semiconductor layer. In this case, in order that the nitride group semiconductor device can be used as a light emitting device or photoreceptor device that includes light-outgoing surface or light-receiving surface, a structure has been known which includes a transparent electrode and a pad electrode. The transparent electrode is formed on substantially the entire surface of the p-type nitride group semiconductor layer as the upper surface of the nitride group semiconductor device. The pad electrode is formed of metal such as Au on the transparent electrode, and can be connected to an external terminal through an electrically conductive wire line. In this the nitride group semiconductor device, the transparent electrode and pad electrode serve as the p-side electrode.

The transparent electrode of the p-side electrode supplies a current through the pad electrode to substantially the entire surface of the p-type nitride group semiconductor layer, and passes light so that the light can outgo in the case of a light emitting device, or so that the light can be incident upon the surface of the p-type nitride group semiconductor layer on the case of a photoreceptor. The transparent electrode can be typically formed from electrically-conductive oxides such as indium tin oxide (ITO), zinc oxide (ZnO), indium oxide ($In_2O_3$), and tin oxide ($SnO_2$). Contrary to this, since the connection area of the n-side electrode to the n-type nitride group semiconductor layer can be small, the n-side electrode is not required to pass light. For this reason, the n-side electrode can be directly formed as a pad electrode on a part of the n-type nitride group semiconductor layer.

This pad electrode used as the n-side electrode typically has a two-layer structure or three-layer structure. The two-layer structure is composed of an ohmic contact layer and a bonding layer. The ohmic contact layer is formed from Al, W, Cr, Ti or the like for good ohmic contact with the n-type nitride group semiconductor. The bonding layer is formed from Au to bring the pad electrode in tight contact with wire. The three-layer structure is composed of these two layers, and a barrier layer that is formed from Pt or the like and arranged between the two layers. On the other hand, since the p-side pad electrode is formed on the transparent electrode, the p-side pad electrode typically includes a bottom layer and a bonding layer. The bottom layer is deposited on the transparent electrode, and is formed from Rh, Pt or the like to bring the p-side pad electrode in tight contact with oxide such as ITO and in good ohmic contact with the p-type nitride group semiconductor through this oxide. The bonding layer is deposited on or above the bottom layer, and is formed from Au or the like. That is, it is necessary to form the n-side and p-side pad electrodes in different structures. If a pad electrode structure can be provided which can be connected to both the n-type nitride group semiconductor and the transparent electrode on the p-type nitride group semiconductor, the n-side and p-side pad electrodes can have the same structure, which in turn can simplify the entire structure of the nitride group semiconductor light emitting device whereby reducing the manufacturing cost. To address this, pad electrode structures for both the n-side p-side pad electrodes have been developed.

See Japanese Patent Laid-Open Publication Nos. JP 2003-224,298 A, and JP 2008-258,615 A The pad electrode is required to be in tight contact with the electrically-conductive oxide, and have high reflectivity. This type of electrode structure for the semiconductor light emitting device has been developed and disclosed in Nos. JP 2003-224,298 A, and JP 2008-258,615 A, for example. JP 2003-224,298 A discloses a Cr/Au electrode. According to this literature, in particular, Cr can be in good ohmic contact and tight contact with the n-type semiconductor layer.

However, since the reflectivity of Cr is low, light from the semiconductor layer will be absorbed by the electrode. Accordingly, the light output is likely to decrease in the case of semiconductor light emitting device.

JP 2008-258,615 A states only that alloys can be selectively used, but does not disclose specific alloys in the embodiments. In addition, in the case where an alloy for the electrodes is simply formed, of alloy is likely to have poor adhesive strength. For this reason, it is difficult that an alloy is practically used for the electrodes.

The present invention is aimed at solving the problem. It is a main objects of the present invention to provide a nitride group semiconductor light emitting device that includes a pad electrode having improved reflectivity whereby providing excellent light outgoing-effect.

SUMMARY OF THE INVENTION

To achieve the above object, a nitride group semiconductor light emitting device according to one aspect of the present invention includes a nitride group semiconductor layer, and an electrode structure. The electrode structure is arranged on or above the semiconductor layer, and includes a plurality of deposited metal layers. The plurality of deposited metal layers of the electrode structure include first and second metal layers. The first metal layer is arranged on the semiconductor layer side. The second metal layer is arranged on or above the first metal layer. The first metal layer contains Cr, and a first metal material. The first metal material has a reflectivity higher than Cr at the light emission peak wavelength of the light emitting device. The second metal layer contains at least Pt or Rh. According to this construction, the first metal layer can have a higher reflectivity as compared with the case where the first metal layer is only formed of Cr, but can keep tight contact with the semiconductor layer.

Furthermore, the content of the first metal material in the first metal layer can fall within the range of not smaller than 70% by weight. According to this construction, it can be ensured that the first metal layer has a higher reflectivity.

Furthermore, the first metal material can be Rh. According to this construction, the first metal layer has a higher reflectivity, and in addition to this the electrode structure can be brought in tight contact with the semiconductor layer as well as the case where the first metal layer is only formed of Cr.

Furthermore, the second metal layer can contain a second metal material that has a reflectivity higher than Pt at the light emission peak wavelength of the nitride group light emitting device. According to this construction, the second metal layer can have a higher reflectivity as compared with the case where the second metal layer is only formed of Pt.

Furthermore, the second metal material can be Rh. According to this construction, the reflectivity of the second metal layer can be improved.

Furthermore, the first and second metal materials can be the same metal material.

Furthermore, the thickness of the first metal layer can fall within the range of not greater than 5 nm.

Furthermore, the first metal material can be at least partially alloyed with Cr in the first metal layer. According to this construction, the first metal layer alloy can provide both high reflectivity and good adhesive strength.

Furthermore, electrode structure can further include a bonding layer that is arranged on or above the second metal layer, and the bonding layer can contain Au.

A nitride group semiconductor light emitting device according to another aspect of the present invention includes a nitride group semiconductor layer, and an electrode structure. The electrode structure is arranged on or above the semiconductor layer, and includes a plurality of deposited metal layers. The plurality of deposited metal layers of the electrode structure includes first, second and third metal layers. The first metal layer is arranged on the semiconductor layer side. The second metal layer is arranged on or above the first metal layer. The third metal layer is arranged on or above the second metal layer. The first metal layer contains Cr, and a first metal material. The first metal material has a reflectivity higher than Cr at the light emission peak wavelength of the light emitting device. The second metal layer contains Pt. The third metal layer contains Ru. The thickness of the second metal layer falls within the range of smaller than 10 nm. It is preferable that the thickness of the second metal layer fall within the range of 3 to 5 nm. According to this construction, it is possible to reduce light absorption of the second metal layer whereby passing light to the interface between the second and third metal layers.

Furthermore, the total thickness of the first and second metal layers can be smaller than the thickness of the third metal layer. According to this construction, the first and second metal layers can sufficiently pass light so that the light can reach the third metal layer. As a result, the light can be reflected by the third metal layer. It is preferable that the total thickness of the first and second metal layers fall within the range of not greater than 50 nm.

Furthermore, the content of Cr in the first metal layer can fall within the range of not less than 30%. According to this construction, it is possible to bring the first metal layer of the electrode structure in tight contact with the semiconductor layer. Therefore, although third metal layer is additionally provided, it is possible to keep the electrode structure in tight contact with the semiconductor layer.

Furthermore, the second metal layer can be entirely formed of Pt. According to this construction, since the second metal layer is formed not of a Pt alloy layer but of a Pt layer, it is possible to suppress that the electrode structure peels off from the semiconductor layer.

Moreover, the thickness of the first metal layer can fall within the range of not smaller than 5 nm. According to this construction, it is possible to improve the reflectivity at the interface between the first and second metal layers. Therefore, the light outgoing efficiency can be improved.

DETAILED DESCRIPTION OF THE EMBODIMENT(S)

The following description will describe embodiments according to the present invention with reference to the drawings. It should be appreciated, however, that the embodiments described below are illustrations of a nitride group semiconductor light emitting device to give a concrete form to technical ideas of the invention, and a nitride group semiconductor light emitting device of the invention is not specifically limited to description below. However, it should be appreciated that the members shown in claims attached hereto are not specifically limited to members in the embodiments. Unless otherwise specified, any dimensions, materials, shapes and relative arrangements of the parts described in the embodiments are given as an example and not as a limitation.

Additionally, the sizes and the positional relationships of the members in each of drawings are occasionally shown larger exaggeratingly for ease of explanation. Members same as or similar to those of this invention are attached with the same designation and the same reference signs, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like. Also, the term "on or above" (e.g., on or above a layer) used in the specification is not limited to the state where a member is formed in direct contact with a layer but occasionally includes the state where a member is formed upward relative to a layer to be spaced away from the member, in other words, the state where a member is formed to interpose an intermediate member between the member and the layer in an inclusive sense.

First Embodiment

Figure 1:
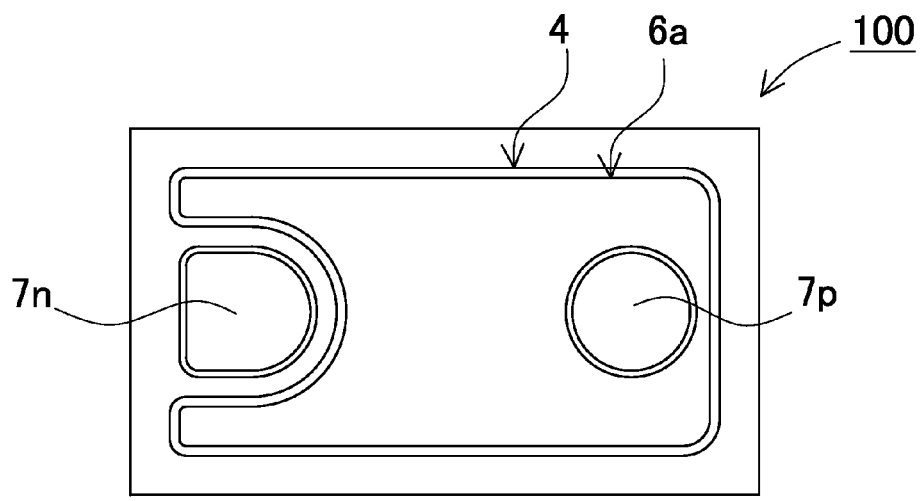
FIG. 1: Plan view of a nitride group semiconductor light emitting device according to a first embodiment of the present invention.
Figure 2:
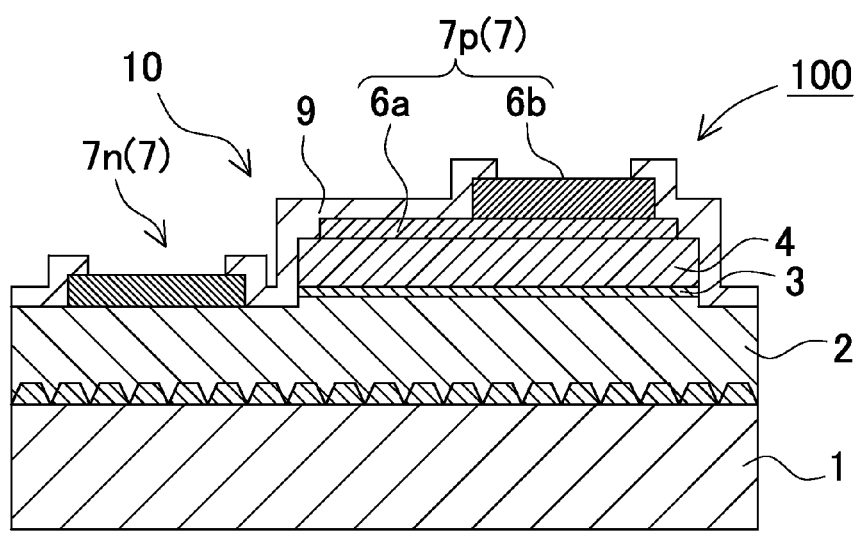
FIG. 2: Schematic cross-sectional view showing the nitride group semiconductor light emitting device shown in FIG. 1.

FIGS. 1 and 2 show a nitride group light emitting device 100 according to a first embodiment of the present invention. As shown in the cross-sectional view of FIG. 2, the light emitting device 100 includes a substrate 1, and a semiconductor structure 10 that is deposited on or above the substrate 1. The semiconductor structure 10 includes n-type and p-type semiconductor layers 2 and 4, and an active layer 3 that is interposed between the n-type and p-type semiconductor layers. That is, the n-type semiconductor layer 2, the active layer 3, and the p-type semiconductor layer 4 are deposited on or above each other in this order on or above the substrate 1, in the light emitting device 100. In addition, the light emitting device 100 includes n-side and p-side electrodes 7n and 7p. The p-type semiconductor layer 4 is partially removed so that the n-type semiconductor layer 2 is exposed. The n-side electrode is formed on the exposed part of the n-type semiconductor layer. The p-side electrode is formed on the main surface of the p-type semiconductor layer 4. When electric power is supplied to the n-type and p-type semiconductor layers 2 and 4 through the n-side and p-side electrodes 7n and 7p, respectively, the active layer 3 emits light. The exterior side of the p-type semiconductor layer 4 as the upper surface of the semiconductor structure 10 serves as a main light emission surface. That is, light mainly outgoes upward in FIG. 1.

The n-side electrode 7n is electrically connected to the n-type nitride group semiconductor layer 2, and serves as a pad electrode. As shown in the plan view of FIG. 1, The n-side electrode is directly formed on the part of the surface of the n-type nitride group semiconductor layer 2 that is exposed by partially removing the p-type nitride group semiconductor layer 4 and active layer 3. The p-side electrode 7p is electrically connected to the p-type nitride group semiconductor layer 4. The p-side electrode is composed of a transparent electrode 6a and a pad electrode (p-side pad electrode) 6b. The transparent electrode is formed on substantially the entire surface of the p-type nitride group semiconductor layer 4. The p-side pad electrode is formed on a part of the transparent electrode 6a. In addition, an electrically insulating protection film 9 covers all the surfaces of the semiconductor structure 10 except the upper surfaces of the n-side and p-side electrodes 7n and 7p.

(Substrate 1)

The substrate 1 can be any substrate on which the semiconductor structure can be epitaxially grown. The size, thickness, and the like of the growth substrate are not specifically limited. Examples of materials for the substrate can be provided by electrically-insulating substrates such as sapphire having C-facet, R-facet or A-facet as primary surface or spinel ($MgAl_2O_4$), silicon carbide (SiC), silicon, ZnS, ZnO, Si, GaAs, diamond, and oxide substrates that are bondable with the nitride group semiconductor in a lattice-matching manner (e.g., lithium niobate and neodymium gallate).

(N-Type Nitride Group Semiconductor Layer, Active Layer 3, P-Type Nitride Group Semiconductor Layer)

The n-type nitride group semiconductor layer 2, the active layer 3, and the p-type nitride group semiconductor layer 4 are preferably formed of gallium nitride group semiconductors such as $In_xAl_yGa_{1-x-y}N$, ($0 \leq x$, $0 \leq y$, $x+y<1$), for example. However, the n-type nitride group semiconductor layer, the active layer, and the p-type nitride group semiconductor layer are not specifically limited to the gallium nitride group semiconductors.

(N-Side and P-Side Electrodes 7n and 7p)

The n-side and p-side electrodes 7n and 7p are electrically connected to the n-type and p-type nitride group semiconductor layers 2 and 4, respectively, so that a current is supplied from the outside. Among nitride group semiconductors, gallium nitride group semiconductor is suitable for n-type and p-type nitride group semiconductor layers to be connected to the n-side and p-side electrodes. However, even suitable gallium nitride group semiconductor is less likely to have high electrical conductivity in the case where the gallium nitride group semiconductor is formed into the p-type semiconductor layer. In other words, the p-type nitride group semiconductor layer 4 will have relatively high electrical resistance. For this reason, if the electrode is only connected to a part of the surface of the p-type nitride group semiconductor layer 4, when a current is supplied to the nitride group semiconductor light emitting device 100, the current cannot spread over the p-type nitride group semiconductor layer 4. As a result, light will be unevenly emitted in the plane of the light emitting device. Accordingly, in order that the current uniformly can flow in the entire plane of the p-type nitride group semiconductor layer 4, the p-side electrode 7p is necessarily connected to a larger area of the surface of the p-type nitride group semiconductor layer 4. In the case where the upper surface of the nitride group semiconductor light emitting device 100 serves as a light-outgoing surface, the transparent electrode 6a of the p-side electrode 7p is directly formed on the entire surface or an area close to the entire surface (substantially entire surface) of the p-type nitride group semiconductor layer 4 in order to prevent the p-side electrode 7p from reducing the light outgoing efficiency. In the p-side electrode 7p, the pad electrode (p-side pad electrode) 6b, which is formed on the transparent electrode 6a, includes Au or the like that has good bonding characteristics, and is arranged on the surface side so that the p-side electrode can be connected to an external circuit by wire-bonding or the like. The p-side pad electrode 6b has a shape and area as viewed in plan view that are required for bonding but do not interrupt light too much. The shape of p-side pad electrode is smaller than the transparent electrode 6a as viewed in plan view. The p-side pad electrode is arranged inside the transparent electrode. That is, the p-side pad electrode is formed on a part of the surface of the transparent electrode 6a.

On the other hand, since the n-type nitride group semiconductor layer 2 can have low electrical resistance, the required connection area for the n-side electrode 7n is small. For this reason, the n-side electrode 7n can include only a pad electrode (n-side pad electrode) that does not pass light. The n-side pad electrode can be directly formed on the n-type nitride group semiconductor layer 2. In order that the n-side pad electrode 7n can be arranged on the upper surface side of the nitride group semiconductor light emitting device 100 according to this embodiment, the active layer 3 and the p-type nitride group semiconductor layer 4 are removed in the connection area for connecting the n-side pad electrode 7n to the n-type nitride group semiconductor layer 2 (see FIG. 2). That is, light is not emitted in this connection area. Accordingly, the n-side electrode (n-side pad electrode) 7n has a shape and area as viewed in plan view that are required for bonding similar to the case of the p-side pad electrode 7p and for electrical connection to the n-type nitride group semiconductor layer 2 but do not reduce the light emission amount too much. The locations of the n-side and p-side pad electrodes 7n and 7p of the nitride group semiconductor light emitting device 100 as viewed in plan view are not specifically limited. The locations of the n-side and p-side pad electrodes 7n and 7p can be determined in consideration of bonding workability, suppression of light interruption amount interrupted by wire lines connected to the n-side and p-side pad electrodes or from the external circuit, and the like.

(Transparent Electrode 6a)

The transparent electrode 6a of the p-side electrode 7p is formed of an electrically-conductive oxide. A metal thin film can also be used as the transparent electrode 6a. However, electrically-conductive oxides have good transparency as compared with metal thin films. For this reason, in the case where the transparent electrode is formed of such an electrically-conductive oxide, the nitride group semiconductor light emitting device 100 can have high light emission efficiency. Examples of electrically-conductive oxides can be provided by oxides containing at least one selected from the group consisting of Zn, In, Sn and Mg, specifically, by ZnO, $In_2O_3$, $SnO_2$, and ITO. In particular, ITO is suitably used as the transparent electrode. The reason is that ITO has high light transparency for visible light (the visible range), and relatively high electrical conductivity.

(Pad Electrode)

In the nitride group semiconductor light emitting device 100 according to this embodiment, the n-side pad and p-side electrodes 7n and 7p have the same deposition structure. Hereinafter, the n-side pad and p-side electrodes are occasionally stated simply as pad electrode 7 for ease of description. As shown in an enlarged cross-sectional view of FIG. 3, the pad electrode 7 includes a bonding layer 73 that is provided to be connected to the outside through the wire line, and arranged as the top layer (the top surface) similar to typical pad electrodes. The pad electrode 7 according to in this embodiment includes an ohmic contact layer 71. The ohmic contact layer is constructed of first and second metal layers 71a and 71b. The first metal layer serves as the bottom layer of the ohmic contact layer. The first and second metal layers are deposited in this order from the bottom side. The metal layers can be formed by well-known methods such as vapor-deposition and sputtering. It is preferable that the metal layers be formed by continuous processes. The shape of the pad electrode 7 (7n, 7p) as viewed in plan view is not specifically limited. The pad electrode can have any desired shape that can be formed by liftoff, etching using photolithography, and the like (for example, see FIG. 1).

The ohmic contact layer 71 is constructed of two layers, which are the first and second metal layers 71a and 71b. The first metal layer 71a is in contact with the n-type nitride group semiconductor layer 2 in the case of the n-side pad electrode 7n, or in contact with the transparent electrode 6a in the case of the p-side pad electrode 7p. The first metal layer 71a contains Cr. Cr can be formed into a film that can be in tight contact with the n-type nitride group semiconductor layer 2 and the transparent electrode 6a, which is formed of the electrically-conductive oxide, and in ohmic contact with the n-type nitride group semiconductor layer 2. However, it cannot be said that Cr has good ohmic contact characteristics with the p-type nitride group semiconductor layer 4 through the electrically-conductive oxide. In more detail, heating Cr will reduce ohmic contact characteristics of Cr with the p-type nitride group semiconductor layer 4. When the nitride group semiconductor light emitting device 100 is installed onto a package, for example, as light emitting apparatus, the nitride group semiconductor light emitting device is subjected to heat-treatment typically at about 300° C. For this reason, the electrode is required to be heat resistance in the characteristic. Here, the second metal layer 71b, which is deposited on the first metal layer 71a, has an effect on the first metal layer. In particular, when the electrode is heated, Pt that is contained in the second metal layer 71b can be diffused into the first metal layer as discussed later. This Pt diffusion can improve ohmic contact characteristics of the ohmic contact layer with the p-type nitride group semiconductor layer 4. That is, in the pad electrodes 7, the n-side or p-side ohmic contact layer 71 is formed of the two layers of the first metal layer 71a and the second metal layers 71b, which is deposited on the first metal layer.

Figure 3:
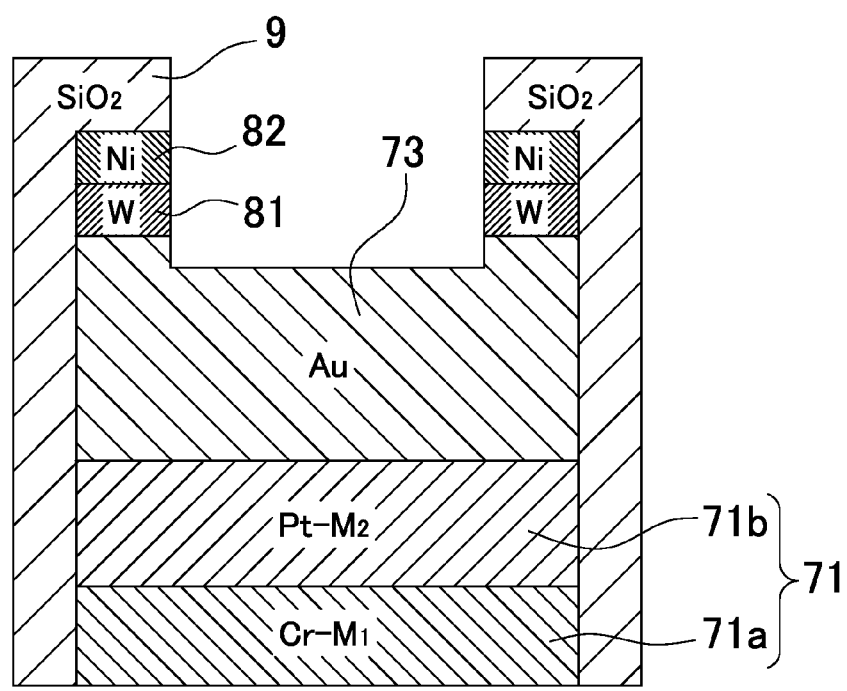
FIG. 3 is an enlarged cross-sectional view showing an electrode part of the device shown in FIG. 2.

It is important for further output improvement of the semiconductor light emitting device to improve the reflectivity of electrode structure. However, according to our tests, it is found that as the reflectivity of electrode structure is increased, the adhesive strength of the electrode structure to the semiconductor layer is likely to decrease. On the other hand, deterioration such as corrosion of electrode structure may occur in some metals. From this viewpoint, it is also important that the electrode structure surely has reliability for long-term stable operation. The inventors of the present invention have diligently studied, and as a result have found that suitable electrode material selection can provide an electrode structure that has high reflectivity, good adhesive strength, and stability. Thus, we have developed the present invention. FIG. 3 shows an illustrative electrode structure according to the present invention. In this embodiment, the p-side and n-side pad electrodes 7p and 7n have the same structure. This illustrated electrode structure includes the first metal layer 71a, the second metal layer 71b, and the bonding layer 73, which are deposited in this order from the semiconductor layer side. In this embodiment, the electrode structure is a multi-layer electrode structure that includes an Au layer as the bonding layer 73.

(Barrier Layer 81)

The surface of the electrode is exposed as a bonding surface to be connected to the metal wire line, while the peripheral parts of the electrode is covered with the protection film 9. A $SiO_2$ film can be suitably used as the protection film 9. The electrode includes a tight-contact layer 82 that is formed of Ni and is arranged in a part to be covered with the $SiO_2$ film. This tight-contact layer can bring the electrode structure in tight contact with the $SiO_2$ film. A W layer is additionally formed as a barrier layer 81 on the Au layer. The reason is that Ni may be diffused into the Au layer, if the Ni layer is directly formed on the upper surface of the Au layer. Thus, the W layer and the Ni layer are formed on the covered part of the upper surface of the Au layer, which is arranged on the peripheral part of the upper surface of the electrode and is covered by the protection film 9, whereby preventing the protection film 9 from peeling off.

(First Metal Layer 71a)

The first metal layer 71a contains Cr, and a first metal material $M_1$ that has a reflectivity higher than Cr. Since the first metal layer 71a contains the first metal material $M_1$, the first metal layer can have a higher reflectivity as compared with the case where the first metal layer 71a contains only Cr. The first metal material $M_1$ can be rhodium, ruthenium, iridium, or the like. It is preferable that the first metal material be rhodium in terms of reflectivity and adhesive strength. In particular, in the case where the first metal layer 71a contains Rh as the first metal material $M_1$ in addition to Cr, Cr and Rh are simultaneously excited by electronic excitation. As a result, the pad electrode can be brought into tight contact with the semiconductor layer.

The content of the first metal material $M_1$ in the first metal layer 71a preferably falls within the range of not smaller than 70% by weight, and more preferably not smaller than 90% by weight. In this specification, although the statement that the first metal layer contains metals refers that the first metal layer 71a contains an alloy of Cr and the first metal material $M_1$, this statement does not necessarily require that Cr and the first metal layer 71a are completely alloyed with each other. In other words, in this specification, this statement can include that the first metal material is not partially alloyed and is contained as an impurity material.

(Production Method of Pad Electrode of Nitride Group Semiconductor Light Emitting Device)

Figure 7:
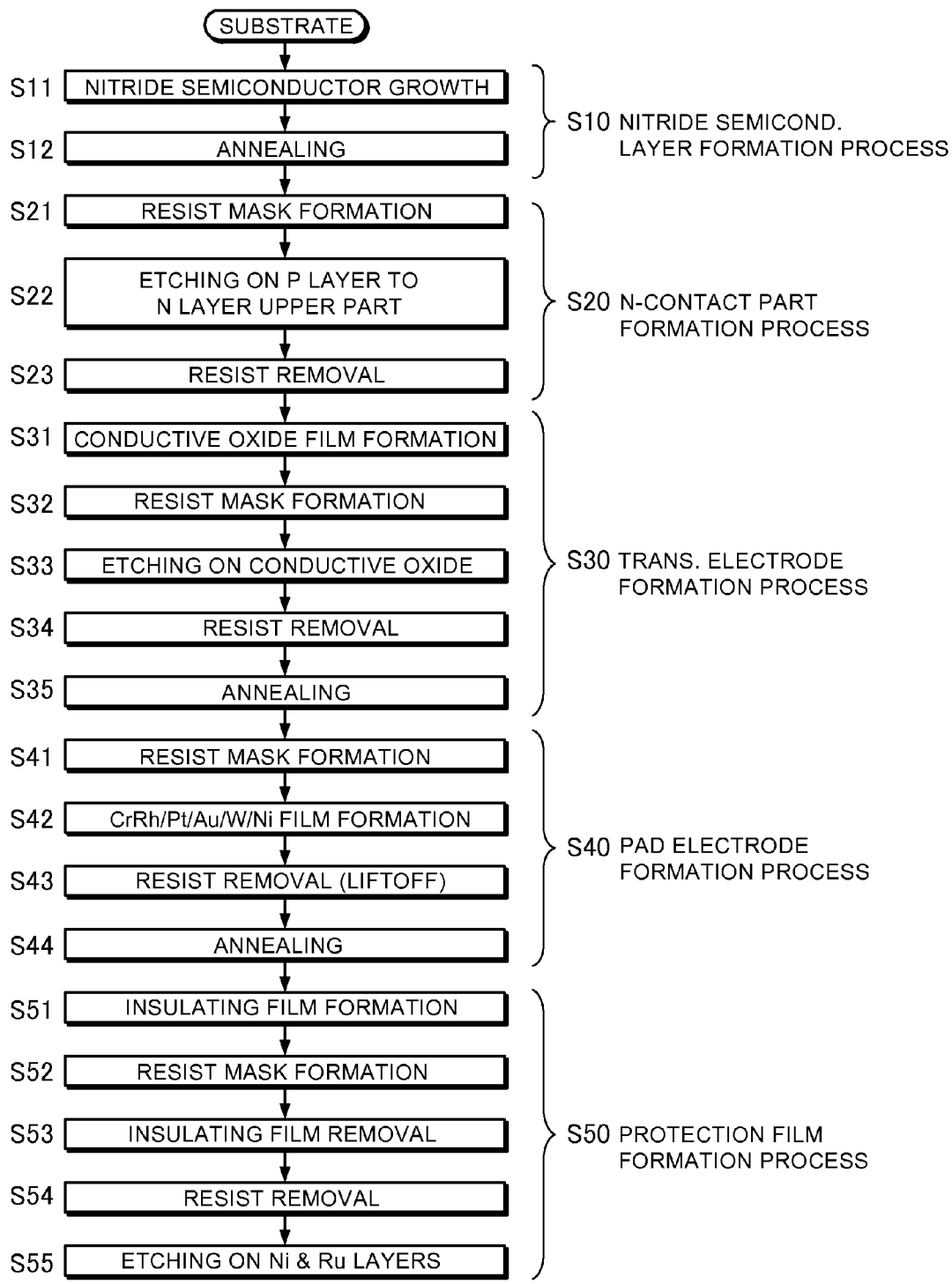
FIG. 7: Flowchart showing a production method of the nitride group semiconductor light emitting device.

The following description describes an illustrative production method of the pad electrode of the nitride group semiconductor light emitting device according to the present invention including the nitride group semiconductor light emitting device according to the foregoing embodiment with reference to FIG. 7.

(Formation of Nitride Group Semiconductor Layer: S10)

A sapphire substrate is used as the substrate 1. Nitride group semiconductors are grown by a MOVPE apparatus so that the n-type nitride group semiconductor layer 2, the active layer 3, and the p-type nitride group semiconductor layer 4 are deposited on or above the substrate 1 (S11 in FIG. 7, hereinafter the step numbers correspond to FIG. 7). More specifically, a first buffer layer, a second buffer layer, an n-side contact layer, a third buffer layer, and an n-side multilayer are grown in this order as components of the n-type nitride group semiconductor layer 2 on the substrate 1. Subsequently, the active layer 3 is grown on the n-side multilayer film. Subsequently, a p-side multi-layer, and a p-side contact layer are grown in this order as the p-type nitride group semiconductor layer 4. After that, the substrate 1 with the grown nitride group semiconductor layers (hereinafter, referred to as wafer) is subjected to annealing in a nitrogen atmosphere at approximately 600° to 700° C. in an annealing chamber of the apparatus so that the electrical resistance of the p-type nitride group semiconductor layer 4 is reduced (S12).

(Formation of Contact Part for N-Side Electrode: S20)

A part of the n-type nitride group semiconductor layer 2 is exposed as a contact part to be connected to the n-side electrode 7n (n-side pad electrode). After annealing, a photoresist is formed into a mask having a predetermined shape on the wafer (S21). Subsequently, the p-type nitride group semiconductor layer 4 and the active layer 3, the n-side multi-layer of the n-type nitride group semiconductor layer 2, and the third buffer layer are removed by reactive ion etching (RIE) so that the n-side contact layer is exposed on the main surface side (S22). After the etching, the resist is removed (S23). In addition, the peripheral part (scribing part) of the nitride group semiconductor light emitting device 100 (chip) can be simultaneously removed with the contact part by etching (see FIG. 2).

(Formation of Transparent Electrode 6a: S30)

An ITO film is formed as the transparent electrode 6a on the entire surface of the wafer by a sputtering device (S31). Subsequently, a photoresist is formed into a mask having a shape corresponding to the shape of the p-type nitride group semiconductor layer 4 as viewed in plan view (see FIG. 1) on the ITO film (S32). Subsequently, the ITO film is partially removed by etching (S33). Thus, the transparent electrode 6a is formed on the p-type nitride group semiconductor layer 4. After the etching, the resist is removed (S34). Subsequently, the wafer is subjected to annealing in a nitrogen atmosphere at approximately 500° C. whereby improving the ohmic contact characteristics of the transparent electrode 6a (ITO film) with the p-type nitride group semiconductor layer 4, and the ohmic contact characteristics of the aforementioned exposed contact area of the n-type nitride group semiconductor layer 2 with the n-side pad electrode 7n (S35).

(Formation of Pad Electrode: S40)

A photoresist is formed into a mask that opens predetermined parts of the exposed n-type nitride group semiconductor layer 2 and the transparent electrode 6a (S41). Subsequently, CrRh, Pt and Au for forming the pad electrodes 7n and 7p, and as well as W and Ni as a protection film primary layer 8, total five layers having predetermined thicknesses are deposited one after another on this mask by the sputtering device (S42). That is, in this case, Rh is used as the first metal material $M_1$, but the second metal material $M_2$ is not included in the electrode shown in FIG. 3. The first and second metal materials $M_1$ and $M_2$ can be suitably modified as shown in examples. After that, the resist is removed together with the metal film arranged on the resist (S43). Thus, the n-side and p-side pad electrodes 7n and 7p are formed in the aforementioned predetermined parts (liftoff). Also, the two layers of the W and Ni layers are deposited on the pad electrodes. The W and Ni layers have the same shape as the pad electrodes as viewed in plan shape.

(Heat Treatment: S44)

The wafer is subjected to heat treatment (annealing) in a nitrogen atmosphere whereby improving the adhesive strength of the pad electrodes 7 to the n-type nitride group semiconductor layer 2 and the transparent electrode 6a. It is preferable that the temperature of heat treatment fall within the range of not lower than 280° C. in order to diffuse Pt of the Pt layer 71b into the CrRh layer 71a. However, the temperature of heat treatment can be suitably adjusted in accordance with the thicknesses of the Pt layer and the CrRh layer. It is preferable that the temperature of heat treatment is not higher than 500° C. The reason is that if the temperature of heat treatment is too high, the heat may cause deterioration of the nitride group semiconductor layers 2, 3 and 4, and bring the electrode in poor ohmic contact with the n-type and p-type nitride group semiconductor layers 2 and 4, which in turn may cause light emission intensity reduction or the like of the nitride group semiconductor light emitting device 100. Also, it is preferable that the heat treatment time fall within the range of 10 to 20 minutes. However, the heat treatment time can be suitably adjusted in accordance with the temperature of heat treatment, and the thickness of the CrRh layer or the like.

(Formation of Protection Film 9: S50)

A SiO$_2$ film is formed as the protection film 9 on the entire surface of the wafer by the sputtering device (S51). A photoresist is formed into a mask that opens predetermined parts of the W and Ni layers on the pad electrodes 7n and 7p (S52). Subsequently, the SiO$_2$ film is partially removed by etching. Subsequently, the resist is removed (S54). The Ni and W layers are partially removed by using the SiO$_2$ film (protection film 9), which is not removed, as a mask by etching so that the Au layer (bonding layer) 73 is exposed in pad parts (S55).

The wafer is divided into nitride group semiconductor light emitting devices 100 (chips) by scribing, dicing, or the like. In addition, before the wafer is divided into chops, the back surface of the substrate 1 may be grinded thinner into a desired thickness (back grinding).

According to the aforementioned processes of the production method of the pad electrode of the nitride group semiconductor light emitting device according to the present invention, since the n-side and p-side pad electrodes can be simultaneously formed in the nitride group semiconductor light emitting device according to the foregoing embodiment, it is possible to improve the productivity.

It should be appreciated that a pad electrode of a nitride group semiconductor light emitting device according to the present invention can be used as only one of the n-side and p-side pad electrodes, while a conventional structure can be used as another of the n-side and p-side pad electrodes (for example, the n-side pad electrode is formed of Cr/Pt/Au, or the p-side pad electrode is formed of Rh/W/Au). Also, the pad electrode of a nitride group semiconductor light emitting device according to the present invention is not limited to the nitride group semiconductor light emitting device according to the foregoing embodiment (see FIG. 1). For example, the pad electrode of a nitride group semiconductor light emitting device according to the present invention can be applied to a nitride group semiconductor light emitting device including the n-side electrode on the back surface (lower surface) of an electrically-conductive substrate (not shown).

EXAMPLES

The following description specifically describes nitride group semiconductor light emitting devices according to examples, which are produced to confirm the effects of the pad electrode structure according to the present invention in comparison with a comparative example, which does not meet the requirements of the present invention. It should be appreciated that the present invention is not limited to the examples.

(Production of Nitride Group Semiconductor Light Emitting Device)

The nitride group semiconductor light emitting devices 100 shown in FIGS. 1 and 2 are produced. As viewed in plan view (see FIG. 1), the nitride group semiconductor light emitting devices 100 has an entire dimension of X (width) 420 μm by Y (length) 240 μm. The p-type nitride group semiconductor layer 4 area (the outline shape including the contact part for the n-side electrodes) has a dimension of X 370 μm by Y 190 μm. The pad electrodes 7n and 7p have a diameter 90 μm (the pad area has a diameter 80 μm). The centers of the pad electrodes 7n and 7p are aligned with the center line in the width direction Y. The center of the n-side pad electrode 7n is positioned at the position 50 μm from one end of the p-type nitride group semiconductor layer 4 in the direction X. The center of the p-side pad electrode 7p is positioned at the position 60 μm from another end (opposite end) of the p-type nitride group semiconductor layer. The distance between the centers of the pad electrodes 7n and 7p is dimensioned 260 μm.

(Formation of Nitride Group Semiconductor Layer)

Nitride group semiconductors are grown as the buffer layer, the n-type nitride group semiconductor layer 2, the active layer 3, and the p-type nitride group semiconductor layer 4 in this order on the substrate 1 (C facet) having φ 3 inches by the MOVPE apparatus with temperature and gas type being changed. After that, the substrate 1 with the grown nitride group semiconductor layers (hereinafter, referred to as wafer) is subjected to annealing in a nitrogen atmosphere at 600° C. in the annealing chamber of the MOVPE apparatus.

(Formation of Contact Part for N-Side Electrode)

After the wafer is removed from the annealing chamber, a resist mask is formed into a predetermined shape on the p-type nitride group semiconductor layer 4. After that, the p-type nitride group semiconductor layer 4 and the active layer 3 are removed by etching so that the n-side contact layer of the n-type nitride group semiconductor layer 2 is exposed as shown in FIG. 2 by a RIE (reactive ion etching) apparatus.

(Formation of Transparent Electrode 6a)

After the wafer is immersed in buffered hydrogen fluoride (BHF, solution of fluoric acid and ammonium fluoride) at room temperature, ITO is formed into a film having thickness of 170 nm by the sputtering device. More specifically, the ITO film is formed on the wafer by electronic excitation of atoms in a sintered compact of $In_2O_3$ and $SnO_2$ as an oxide target in an Ar atmosphere. Subsequently, a resist mask is formed so that the ITO film is arranged on substantially the entire surface of the p-type nitride group semiconductor layer 4. Subsequently, the resist is removed by etching. After that, in order to bring the ITO film into good ohmic contact with the p-type nitride group semiconductor layer, the wafer is subjected to annealing in a nitrogen atmosphere at 500° C. Thus, the transparent electrode 6a is formed.

(Formation of Pad Electrode)

A resist mask is formed which opens predetermined parts of the n-side electrode contact part of the n-type nitride group semiconductor layer 2 (n-side contact layer) and the transparent electrode 6a. Subsequently, $Cr+M_1$, $Pt+M_2$ and Au for the pad electrodes 7 (7n, 7p), and W and Ni for the primary layer 8 for the protection film 9 are deposited in this order one after another on the wafer by the sputtering device. Subsequently, the resist is removed (liftoff). Thus, the n-side and p-side pad electrodes 7n and 7p are formed which have the six-layer film structure and the predetermined shapes as viewed in plan view (see FIG. 1). Table 1 shows the thicknesses of pad electrodes 7.

TABLE 1

| | Pad Structure | |
| --- | --- | --- |
| | Content of Cr | |
| Comp. Ex | 100% by weight | Cr/Pt/Ru/Au |
| Ex. 1 | 50% by weight | Cr—Rh/Pt/Ru/Au |
| Ex. 2 | 30% by weight | Cr—Rh/Pt/Ru/Au |
| Ex. 3 | 10% by weight | Cr—Rh/Pt/Ru/Au |
| Ex. 4 | 5% by weight | Cr—Rh/Pt/Ru/Au |
| Ex. 5 | 2.5% by weight | Cr—Rh/Pt/Ru/Au |
| | Content of Pt | |
| Ex. 6 | 0% by weight | Cr—Rh/Rh/Au |
| Ex. 7 | 10% by weight | Cr—Rh/Pt—Rh/Au |
| Ex. 8 | 30% by weight | Cr—Rh/Pt—Rh/Au |
| Ex. 9 | 50% by weight | Cr—Rh/Pt—Rh/Au |
| Ex. 10 | 100% by weight | Cr—Rh/Pt/Au |

(Heat Treatment of Pad Electrode)

After that, the wafer is subjected to annealing in a nitrogen atmosphere at an annealing chamber. The maximum continuous annealing time is limited to 10 minutes. In the case where the wafer is subjected to annealing for 20 minutes, the wafer is subjected to 10-minute annealing twice. An electric furnace is used when the wafer is subjected to annealing at 280° C.

(Formation of Protection Film 9)

A $SiO_2$ film having thickness 200 nm is entirely formed as the protection film 9 on the surface on the wafer. A resist mask is formed which opens parts corresponding to the pad parts of the pad electrodes 7n and 7p. Subsequently, the $SiO_2$ film is partially removed by etching. After that, the resist is removed. In addition, the primary layer 8 of the Ni and W layers are removed by etching so that the Au layer 73 in the pad electrodes 7n and 7p is exposed. Thus, the nitride group semiconductor light emitting device 100 is produced. In addition, the substrate is subjected to grinding from the back surface side of the wafer (back grinding) so that the entire thickness of the device is dimensioned to 85 μm.

Examples 1-5

Figure 4:
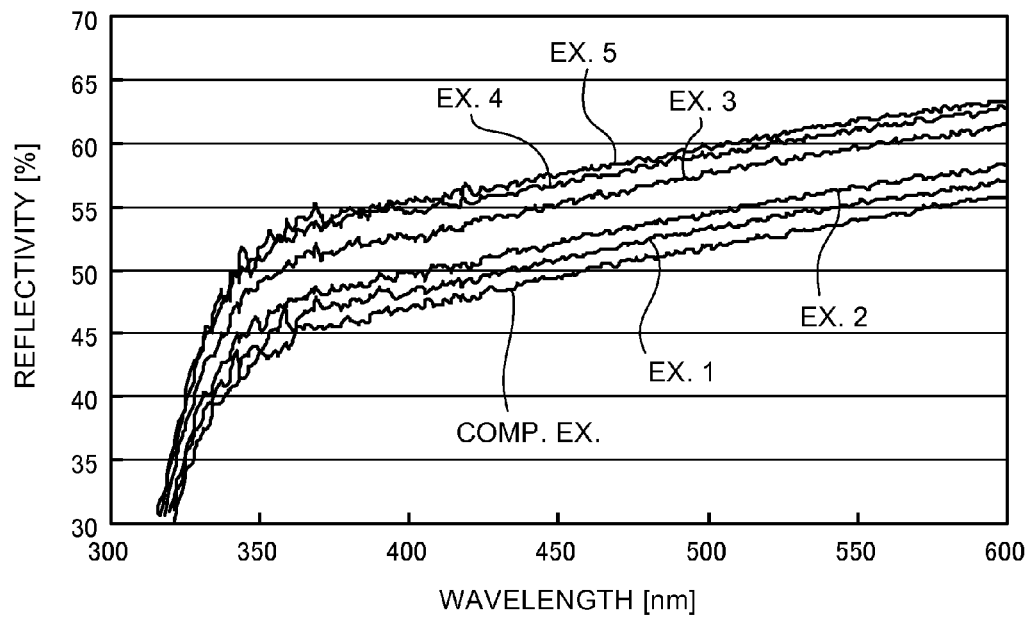
FIG. 4: Graph of reflectivity vs. wavelength of electrode structures according to Examples 1 to 5 obtained by measurement.

The content of the first metal material $M_1$ and the reflectivity of electrode structure are confirmed in a comparative test. In this test, Rh is used as the first metal material $M_1$. The nitride group semiconductor light emitting devices according to the Examples 1 to 5 are produced which include the electrode structures having different amounts of Rh. A nitride group semiconductor light emitting device according to the comparative example is also produced which includes the electrode structures having the first metal layer 71a that is only formed of Cr for comparison. Specifically, the second metal layer 71b is a Pt layer, and the bonding layer 73 is an Au layer in each example. The contents of Cr in the first metal layers 71a according to the examples 1, 2, 3, 4 and 5 are 50%, 30%, 10%, 50% and 2.5% by weight, respectively. In the comparative example, the content of Cr in the first metal layer 71a is 100%. The second metal layer 71b in the comparative example is a Pt layer similar to the examples. A Ru layer is sandwiched between the Pt layer and an Au layer, which serves as the bonding layer 73. FIG. 4 is a graph showing the reflectivity vs. wavelength of the electrode structures according to the examples. As shown in this graph, the reflectivity increases as the content of Cr decreases, in other words, as the content of Rh as the first metal material $M_1$ increases. In particular, it is found that the reflectivity can be not smaller than 50% in the wavelength range of not shorter than 400 nm in the case where the content of the first metal material $M_1$ is not smaller than 90% by weight. More preferably, in the case where the content of the first metal material $M_1$ is not smaller than 95% by weight, the reflectivity can be higher.

(Second Metal Layer 71b)

Figure 5:
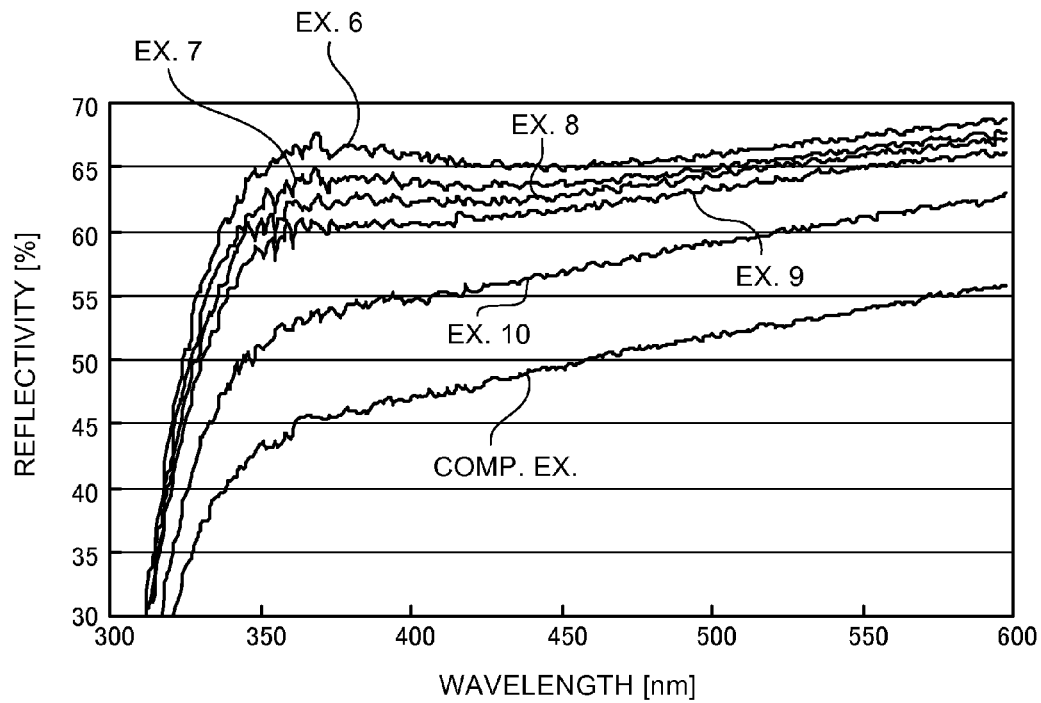
FIG. 5: Graph showing reflectivity vs. wavelength of electrode structures according to Examples 6 to 10 obtained by measurement.

Although it has been described that the second metal layer 71b is only formed of Pt, the second metal layer 71b can contain the second metal material $M_2$ having a high reflectivity, which can increase the reflectivity of the electrode. The second metal material $M_2$ is selected from metal materials that have a reflectivity higher than Cr at the light emission peak wavelength of the nitride group light emitting device. The second metal material $M_2$ can be rhodium, ruthenium, iridium, or the like. In particular, it is preferable that the second metal material be rhodium, since rhodium has high reflectivity. Nitride group light emitting devices according to examples 6 to 10 are produced which include the second metal layer containing the second metal material. In this test, electrode structures are produced which have different contents of Pt in the second metal layers, and the reflectivity of each electrode structure is measured. Specifically, each of the first metal layers 71a according to these examples is formed of Cr and Rh. The content of Cr is 5% by weight in each example. The second metal layers 71b according to these examples is formed of Pt and Rh. The second metal layers contain different amounts of Rh. More specifically, in the example 6, the content of Pt is 0% by weight, in other words, the second metal layer is only formed of Rh. In the example 7, the content of Pt is 10% by weight. In the example 8, the content of Pt is 30% by weight. In the example 9, the content of Pt is 50% by weight. In the example 10, the content of Pt is 100% by weight, in other words, the second metal layer does not contain Rh similar to the example 4. FIG. 5 is a graph showing the result. The comparative example is also shown for comparison in this graph similar to FIG. 4. According to this graph, the reflectivity can be further improved. In particular, in the case where the content of Rh as the second metal material $M_2$ falls within the range of not less smaller than 50%, the reflectivity can be not smaller than 65%. According to this result, in the case where the second metal layer 71b is not only formed of Pt but contains the second metal material $M_2$ having a high reflectivity such as Rh, the reflectivity can be further improved. However, in the case where the second metal layer 71b is formed of an alloy, the adhesive strength of electrode structure to the semiconductor layer is likely to decrease. For this reason, the content of the second metal material can be selected in consideration of the balance between the reflectivity and adhesive strength.

It is preferable that the first and second metal materials $M_1$ and $M_2$ have reflectivity higher than not only Cr but Pt. In addition, it is preferable that the first and second metal materials $M_1$ and $M_2$ are the same material. The reason is that the influence of metal material diffusion can be reduced. However, in order to adjust the reflectivity, the first and second metal materials $M_1$ and $M_2$ can be different materials.

(Thickness)

In addition, the relationship between thickness and adhesive strength of the first metal layer 71a is confirmed in our test. In this peel test, Rh is used as the first metal material $M_1$. The content of Rh is 95%. The second metal layer 71b is formed of Pt, and has thickness of 50 nm. The bonding layer 73 is formed of Au, and has thickness of 500 nm. The first metal layers 71a have different thicknesses in the range of 0 to 50 nm. In the peel test, about 1000 LED chips are used. In each chip, an Au wire line having φ 30 μm is bonded onto the pad electrode by a wire-bonding apparatus (FB-150DGII of KAIJO). The number of samples is counted if the p-side pad electrode is peeled off from the primary layer (ITO film) or if one layer of the p-side pad electrode is peeled off from another layer. The bonding load of the wire-bonding apparatus is set to 40 gf, which is higher than the typical value, so that the peel test is conducted on the condition that peel is more likely to occur (accelerated life test). In addition, the bonding position in the test is deviated from the typical position.

Figure 6:
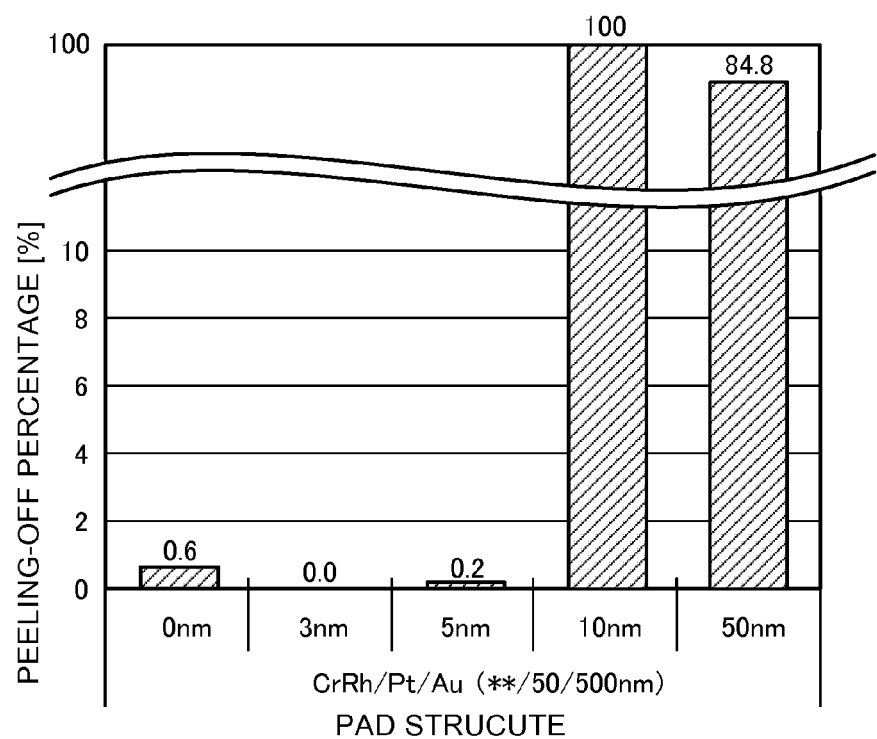
FIG. 6: Graph showing the result of peel test in different thicknesses of a first metal layer.

FIG. 6 is a graph showing the result of the peel test. According to the graph of FIG. 6, in the case where the thickness of the first metal layer 71a is smaller than 10 nm, in particular, not greater than 5 nm, the percentage of peeling-off samples can be suppressed, in other words, it is confirmed that high adhesive strength can be provided. Especially, in the case where the thickness of the first metal layer falls within the range of 3 to 5 nm, the electrode can be excellent in adhesive strength.

Second Embodiment

Figure 8:
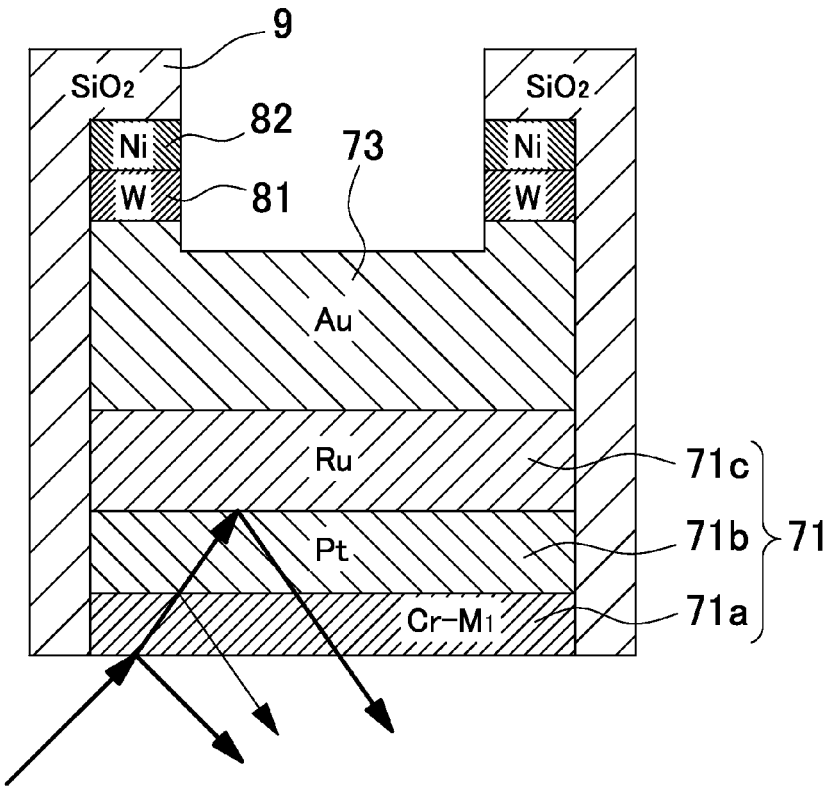
FIG. 8: Cross-sectional view schematically showing an electrode structure of a nitride group semiconductor light emitting device according to a second embodiment.

Although it has been described that the nitride group semiconductor light emitting device includes the ohmic contact layer consisting of the first and second metal layers, the present invention is not limited to this. The nitride group semiconductor light emitting device can additionally have a third metal layer in the ohmic contact layer. FIG. 8 shows this type of nitride group semiconductor light emitting device as a second embodiment. The pad electrode of this illustrated light emitting device includes the first metal layer 71a, the second metal layer 71b, and a third metal layer 71c as the ohmic contact layer 71. The first metal layer is the Cr-$M_1$ layer. The second metal layer is the Pt layer, and is deposited on the first metal layer. The third layer is formed of Ru, and is deposited on the second metal layer. The Au layer is formed as the bonding layer 73 on the ohmic contact layer.

(Small Thickness of Second Metal Layer)

It is preferable that the second metal layer 71b have a small thickness. In the case where the second metal layer 71b has a small thickness, it is possible to further improve the light outgoing efficiency. That is, although light can be reflected by the lower surface of the first metal layer 71a of the pad electrode, a part of the light that will partially pass through the first metal layer 71a is intended not to be reflected at the boundary between the first and second metal layers 71a and 71b but to pass the second metal layer 71b so that the part of the light can be reflected at the boundary between the second and third metal layers 71b and 71c toward the semiconductor layer side. As a result, in the case where the second metal layer 71b is thin, it is possible to suppress that the second metal layer 71b absorbs light that passes through the first metal layer 71a.

(Third Metal Layer 71b)

In this embodiment, the third metal layer 71c is additionally provided so that light can be reflected at the boundary between the second and third metal layers 71b and 71c after the light passes through the second metal layer. In addition, the third metal layer 71c can prevent diffusion of Au of the bonding layer into the first and second metal layers 71a and 71b. Rh, Ir and the like as well as Ru can be used as metal materials to be contained in the third metal layer 71c. In particular, it is preferable that the third metal layer be formed as Ru layer to prevent the pad electrode from peeling off as discussed later.

(Thickness)

It is preferable that the thickness of the second metal layer 71b fall within the range of smaller than 10 nm, more preferably of 3 to 5 nm. In the case where the thickness of the second metal layer falls within the above range, it is possible to reduce absorption of light by the second metal layer 71b. As an example 11, pad electrodes are produced which include the first metal layer 71a formed of RhCr (3 nm), the second metal layer 71b formed of Pt, the third metal layer 71c formed of Ru (75 nm), and the bonding layer formed of Au (500 nm). The content of Cr is 30% in the first metal layer. The pad electrodes include the first metal layers 71a having different thicknesses ranging from 0 to 30 nm. The reflectivity of the electrode is measured when the electrode is radiated with light having wavelength of 455 nm. Table 2 shows the result. According to this table, it is confirmed that, in the case where the thickness of the second metal layer is smaller than 10 nm, the reflectivity can be high, in particular, in the case where the thickness of the second metal layer falls within the range of 3 to 5 nm, the reflectivity can be not smaller than 60%.

TABLE 2

| | Cr Thickness (nm) | | | | | |
|---|---|---|---|---|---|---|
| | 0 | 3 | 5 | 10 | 20 | 30 |
| Reflectivity | 59.5% | 60.3% | 60.2% | 58.2% | 55.5% | 53.2% |

In addition, it is preferable that the total thickness of the first and second metal layers 71a and 71b, (i.e., the thickness of the ohmic contact layer) be not greater than 50 nm, more preferably, not greater than 10 nm. In this case, the ohmic contact layer can sufficiently pass light so that the light can reach the third metal layer 71c. As a result, the light can be reflected by the third metal layer.

On the other hand, it is preferable that the thickness of the third metal layer 71c is greater than 50 nm. In this case, light can be sufficiently reflected at the lower surface of the third metal layer 71c after passing through the ohmic contact layer. In addition, it is more preferable that the thickness of the third metal layer is not smaller than 75 nm. In this case, it is possible to prevent diffusion of Au from the Au layer, which is the bonding layer deposited on the third metal layer 71c.

(Content of Cr in First Metal Layer)

In addition, it is preferable that the first metal layer 71a of the electrode structure according to the second embodiment contain a high content of Cr. According to our test, in the case where the electrode structure additionally includes the third metal layer 71c in the pad electrode, it is found that the adhesive strength is likely to decrease. Also, the adhesive strength of the pad electrode is influenced by the content of Cr in the first metal layer. It is found that the adhesive strength is likely to increase as the content of Cr increases. From the findings, in the case where the electrode structure additionally includes the third metal layer 71c, when the first metal layer 71a contains a high content of Cr, the adhesive strength of the pad electrode can be high. As a result, it is possible to suppress that the electrode structure is peeled off. It is preferable that the content of Cr in the first metal layer 71a be approximately 30% or more. As an example 12, pad electrodes are produced which include the first metal layer 71a formed of RhCr (3 nm), the second metal layer 71b formed of Pt (5 nm), the third metal layer 71c formed of Ru (75 nm), and the bonding layer formed of Au (500 nm). The adhesive strength is measured in the case where the first metal layers 71a contain 5%, 10%, and 30% of Cr. Table 3 shows the result. In each electrode structure, an Au wire line having φ 30 μm is bonded onto the pad electrode by the wire-bonding apparatus (FB-150DGII of KAIJO). The number of samples is counted if the pad electrode is peeled off from the primary layer (ITO film) or if one layer of the pad electrode is peeled off from another layer. Table 3 shows the percentage of peeling-off samples relating to the adhesive strength.

TABLE 3

| | Cr Content (%) | | |
|---|---|---|---|
| | 5 | 10 | 30 |
| Peeling-Off Percentage | 98% | 77% | 0% |

In addition, it is found that, in the case where the third metal layer 71c is formed of Ru instead of Rh, it is possible to suppress that the pad electrode peels off. In addition, in the case where the second layer is formed not of a Pt alloy but of Pt, the adhesive strength can be high, which in turn can suppress that the pad electrode peels off.

In the case where the first metal layer 71a contains a high content of Cr, it is found that the reflectivity is likely to become higher as thickness of the first metal layer becomes smaller. From this viewpoint, it is preferable that the thickness of the first metal layer 71a fall within the range of not greater than 5 nm, more preferably of not greater than 3 nm.

Figure 9:
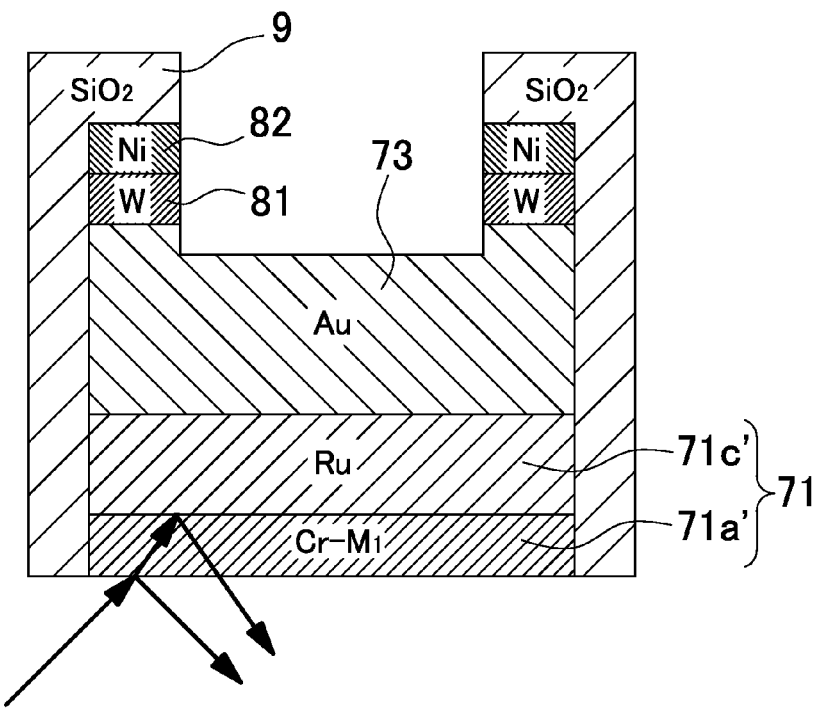
FIG. 9: Schematic cross-sectional view showing an electrode structure that does not include a second metal layer of the electrode structure shown in FIG. 8.

The second metal layer as Pt layer is formed thin in the foregoing examples in order to pass light. This layer can be omitted. FIG. 9 shows this type of electrode structure. This illustrated electrode structure includes the first metal layer 71a' and the third metal layer 71c' in this order from the semiconductor layer side. In comparison with the electrode structure shown in FIG. 3, it can conceived that Ru is used for the second metal layer 71b instead of Pt or Rh.

Third Embodiment

Figure 10:
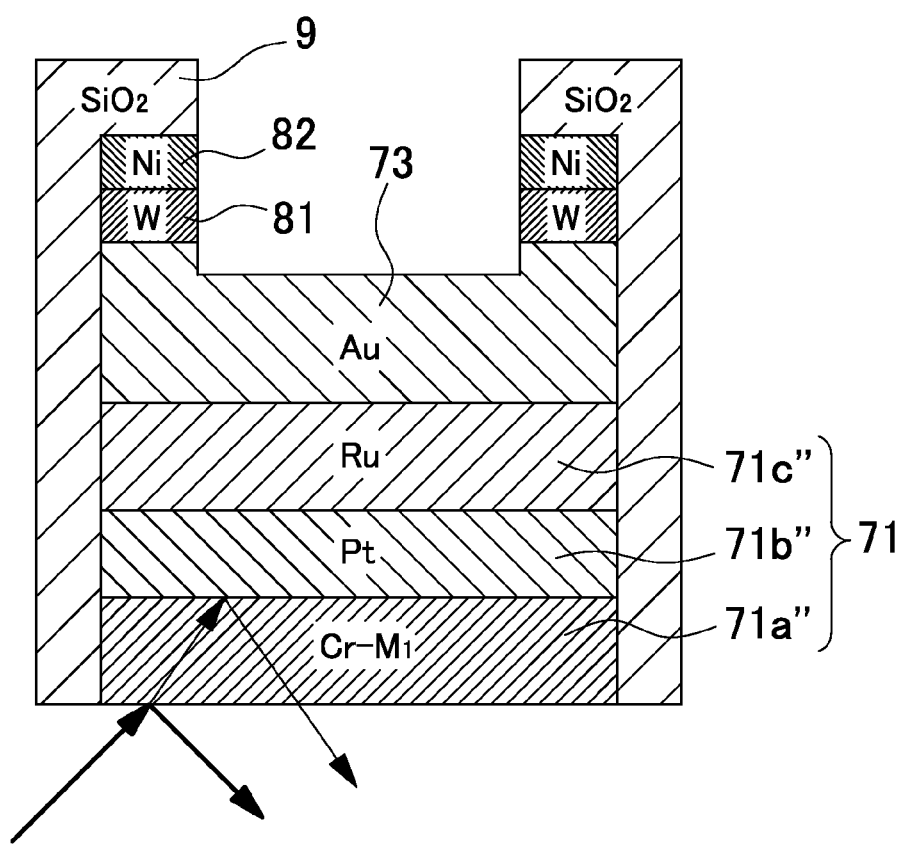
FIG. 10: Cross-sectional view schematically showing an electrode structure of a nitride group semiconductor light emitting device according to a third embodiment.

It has been described that the electrode structure according to the second embodiment is constructed for reflection at the boundary between the semiconductor layer and the first metal layer 71a, and the boundary between the second and third metal layers 71b and 71c as shown in FIG. 8. However, the present invention is not limited to this construction. The first metal layer can be constructed to place more weight on reflection. FIG. 10 shows this type of electrode structure as a third embodiment. This illustrated electrode structure includes the first metal layer 71a", the second metal layer 71b", and third metal layer 71c" in this order from the semiconductor layer side similar to the electrode structure shown in FIG. 8. According to our test, generally, it is found that the reflectivity is likely to become higher as the thickness of the first metal layer becomes smaller. However, if the first metal layer is too thin, the adhesive strength between the pad electrode and the semiconductor layer decreases so that the pad electrode may be more easily peeled off from the semiconductor layer. According to our test, in the case where the thickness of the first metal layer is not greater than 3 nm, it is apparent that the pad electrode is likely to be peeled off from the semiconductor layer. On the other hand, the relationship between adhesive strength and the reflectivity is also influenced by the content of Cr in the first metal layer. In the case where the content Cr is not greater than 5%, it is found that the reflectivity becomes higher as the thickness of the first metal layer becomes greater. From the findings, in consideration of the balance between reflectivity and adhesive strength, the thickness of the first metal layer is dimensioned approximately 10 nm. As a result, it is possible to provide both good adhesive strength and high reflectivity. In this case, light can be reflected at the boundary between the first metal layer and the semiconductor layer. Therefore, it is possible to improve the light-outgoing efficiency. As an example 13, pad electrodes are produced which include the first metal layer 71a" formed of RhCr, the second metal layer 71b" formed of Pt, the third metal layer 71c" formed of Ru, and the bonding layer formed of Au. The content of Cr is 10% in the first metal layer. The pad electrodes include the first metal layers 71a" having different thicknesses. The reflectivity of the electrodes is measured (in irradiation of light having wavelength of 455 nm), while the adhesive strength is measured (obtained as the percentage of peeling-off samples in the accelerated wire-bonding life test). Table 4 shows the result. According to this table, it is confirmed that the thickness of the first metal layer 71a" preferably is not smaller than 5 nm, more preferably is approximately 10 nm. In this case, it is possible to improve the adhesive strength and to surely provide sufficient reflectivity.

TABLE 4

| | Cr Thickness (nm) | | | | |
|---|---|---|---|---|---|
| | 3 | 5 | 10 | 20 | 30 |
| Reflectivity | 62.6% | 62.3% | 60.2% | 58.5% | 57.7% |
| Peeling-Off Percentage | 77% | 4% | 0% | 6% | 2% |

In formation of the layers, each layer is formed to desired composition. After the light emitting device is produced, it can be conceived that metal atoms of one metal layer may slightly be diffused into or mixed with another metal layer in the boundary part between the layers. However, in the present invention, such a boundary part is not defined as metal layer.

A nitride group semiconductor light emitting device according to the present invention can be applied to a light source for lighting, a light emitting device, an LED display that includes light emitting devices arranged in a matrix shape, a light source for backlighting, a traffic light, an illuminated switch, various sensors such as image scanner, and various indicators, and the like.

The invention claimed is:

1. A nitride group semiconductor light emitting device comprising:
    a nitride group semiconductor layer, and
    an electrode structure that is arranged on or above said semiconductor layer, and includes a plurality of deposited metal layers,
    wherein said plurality of deposited metal layers of the electrode structure include
        a first metal layer that is arranged on said semiconductor layer side, and
        a second metal layer that is arranged on or above said first metal layer,
    wherein said first metal layer contains Cr, and a first metal material that has a reflectivity higher than Cr at the light emission peak wavelength of said light emitting device,
    wherein said second metal layer contains at least Pt or Rh, and
    wherein the content of Cr in said first metal layer falls within 2.5 wt % to 50 wt %.

2. The nitride group semiconductor light emitting device according to claim 1, wherein said first metal material is Rh.

3. The nitride group semiconductor light emitting device according to claim 1, wherein said second metal layer contains a second metal material that has a reflectivity higher than Pt at the light emission peak wavelength of said nitride group light emitting device.

4. The nitride group semiconductor light emitting device according to claim 3, wherein said second metal material is Rh.

5. The nitride group semiconductor light emitting device according to claim 3, wherein said first and second metal materials are the same metal material.

6. The nitride group semiconductor light emitting device according to claim 1, wherein the thickness of said first metal layer falls within the range of not greater than 5 nm.

7. The nitride group semiconductor light emitting device according to claim 1, wherein said first metal material is at least partially alloyed with Cr in said first metal layer.

8. The nitride group semiconductor light emitting device according to claim 1, wherein said electrode structure further includes a bonding layer that is arranged on or above said second metal layer, wherein said bonding layer contains Au.

9. A nitride group semiconductor light emitting device comprising:
    a nitride group semiconductor layer, and
    an electrode structure that is arranged on or above said semiconductor layer, and includes a plurality of deposited metal layers,
    wherein said plurality of deposited metal layers of the electrode structure include
        a first metal layer that is arranged on said semiconductor layer side, and
        a second metal layer that is arranged on or above said first metal layer, and
        a third metal layer that is arranged on or above said second metal layer,
    wherein said first metal layer contains Cr, and a first metal material that has a reflectivity higher than Cr at the light emission peak wavelength of said light emitting device,
    wherein said second metal layer contains Pt,
    wherein said third metal layer contains Ru, and wherein the thickness of said second metal layer falls within the range of smaller than 10 nm wherein the content of Cr in said first metal layer falls within the range of not less than 30%.

10. The nitride group semiconductor light emitting device according to claim 9, wherein the thickness of said second metal layer falls within the range of 3 to 5 nm.

11. The nitride group semiconductor light emitting device according to claim 9, wherein the total thickness of said first and second metal layers is smaller than the thickness of said third metal layer.

12. The nitride group semiconductor light emitting device of according to claim 9, wherein the total thickness of said first and second metal layers falls within the range of not greater than 50 nm.

13. The nitride group semiconductor light emitting device according to claim 9, wherein said second metal layer is entirely formed of Pt.

14. The nitride group semiconductor light emitting device according to claim 9, wherein the thickness of said first metal layer falls within the range of not smaller than 5 nm.

15. The nitride group semiconductor light emitting device according to claim 1, wherein said first metal material is Rh, Ru, or Ir.

16. The nitride group semiconductor light emitting device according to claim 1, wherein said first metal material is selected from the group consisting of Rh, Ru, and Ir.

17. The nitride group semiconductor light emitting device according to claim 1, wherein a thickness of the second layer is substantially constant between respective ends of said second layer.

18. The nitride group semiconductor light emitting device according to claim 1, wherein at least the second layer is entirely enclosed within a protection film.

19. A nitride group semiconductor light emitting device comprising:
    an underlayer including a nitride group semiconductor layer, and
    an electrode structure that is arranged on or above said underlayer, and includes a plurality of deposited metal layers,
    wherein said plurality of deposited metal layers of the electrode structure include
        a first metal layer that is arranged on said underlayer side, and
        a second metal layer that is arranged on or above said first metal layer,
    wherein said first metal layer contains Cr, and a first metal material that has a reflectivity higher than Cr at the light emission peak wavelength of said light emitting device,
    wherein said second metal layer contains at least Pt or Rh,
    wherein said first metal layer is in direct contact with said underlayer, and
    wherein an end of said second metal layer is in a non-contacting state with the underlayer wherein the content of Cr in said first metal layer falls within 2.5 wt % to 50 wt %.

* * * * *